US008243425B2

(12) United States Patent
Yang et al.

(10) Patent No.: US 8,243,425 B2
(45) Date of Patent: Aug. 14, 2012

(54) KEY ASSEMBLY AND PORTABLE ELECTRONIC DEVICE USING THE SAME

(75) Inventors: Mu-Wen Yang, Taipei Hsien (TW); Chih-Chiang Chang, Taipei Hsien (TW)

(73) Assignee: FIH (Hong Kong) Limited, Kowloon (HK)

( * ) Notice: Subject to any disclaimer, the term of this patent is extended or adjusted under 35 U.S.C. 154(b) by 401 days.

(21) Appl. No.: 12/538,279

(22) Filed: Aug. 10, 2009

(65) Prior Publication Data

US 2010/0134965 A1 Jun. 3, 2010

(30) Foreign Application Priority Data

Dec. 2, 2008 (CN) .......................... 2008 1 0305921

(51) Int. Cl.
*H05K 7/12* (2006.01)

(52) U.S. Cl. ......... 361/679.08; 361/679.09; 361/679.01; 200/5 A

(58) Field of Classification Search ............. 361/679.08, 361/679.02, 679.01; 341/22–33; 400/472–496; 345/168–172; 200/5 R, 5 A
See application file for complete search history.

(56) References Cited

U.S. PATENT DOCUMENTS

| | | | | |
|---|---|---|---|---|
| 6,653,585 | B2 * | 11/2003 | Chun | 200/344 |
| 6,930,264 | B2 * | 8/2005 | Nagai et al. | 200/252 |
| 8,022,944 | B2 * | 9/2011 | Suzuki et al. | 345/184 |
| 2001/0007449 | A1 * | 7/2001 | Kobachi et al. | 345/156 |

* cited by examiner

*Primary Examiner* — Jinhee Lee
*Assistant Examiner* — Ingrid Wright
(74) *Attorney, Agent, or Firm* — Altis Law Group, Inc.

(57) ABSTRACT

A key assembly comprises a base plate, two resisting mechanisms and a key body. The resisting mechanisms and the key body are mounted the base plate, and the resisting mechanisms are respectively located at two opposite ends of the key body. When the key body slides toward and compresses one of the resisting mechanisms, said another one of the resisting mechanisms is stretched.

18 Claims, 5 Drawing Sheets

KEY ASSEMBLY AND PORTABLE ELECTRONIC DEVICE USING THE SAME

This application is related to co-pending U.S. patent application Ser. Nos. 12/538,274, 12/538,277, 12/538,278, entitled "KEY ASSEMBLY AND PORTABLE ELECTRONIC DEVICE USING THE SAME", by Mu-Wen Yang et al. Such applications have the same assignee and inventorship as the present application and have been concurrently filed herewith. The above-identified applications are incorporated herein by reference.

BACKGROUND

1. Technical Field

The exemplary disclosure generally relates to key assemblies, and particularly to key assemblies used in portable electronic devices.

2. Description of Related Art

With the development of smaller and lighter electronic devices for portable use, key assemblies become more compact with individual keys more tightly spaced. Unfortunately, users of these portable electronics devices sometimes experience difficulty in activating keys that are close together; multiple and/or erroneous keys may be activated at the same time. This drawback exists not only in cellular telephones, but other portable electronic devices with key assemblies.

Therefore, there is room for improvement within the art.

BRIEF DESCRIPTION OF THE DRAWINGS

Many aspects of the exemplary embodiments can be better understood with references to the following drawings. The components in the drawings are not necessarily drawn to scale, the emphasis instead being placed upon clearly illustrating the principles of the exemplary key assembly and portable electronic device using key assembly. Moreover, in the drawings like reference numerals designate corresponding parts throughout the several views. Wherever possible, the same reference numbers are used throughout the drawings to refer to the same or like elements of an exemplary embodiment.

DETAILED DESCRIPTION

Figure 1:
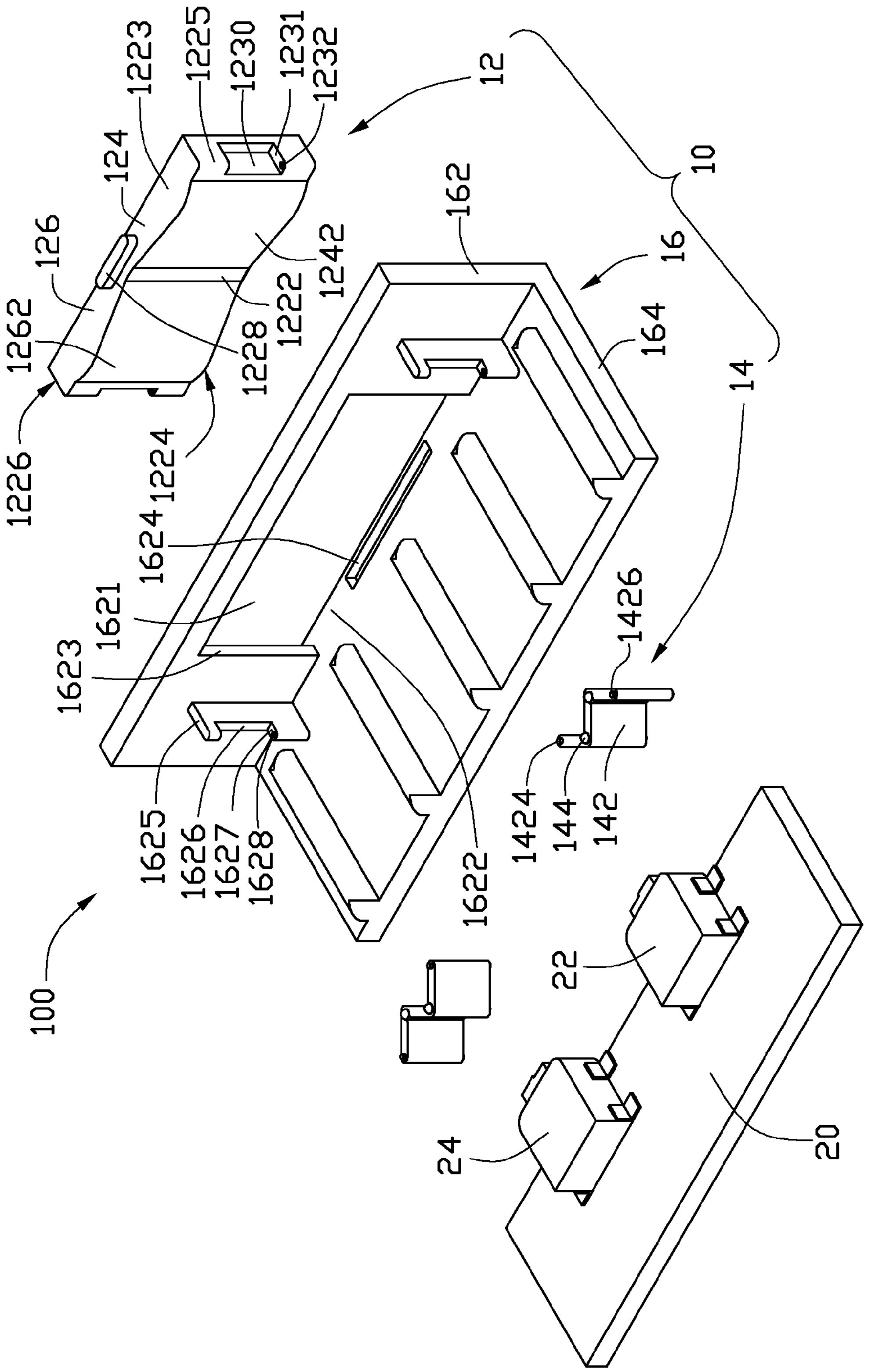
FIG. 1 is an exploded view of one exemplary embodiment of a key assembly used in a portable electronic device, the portable electronic device including the key assembly, a housing, and a circuit board.
Figure 2:
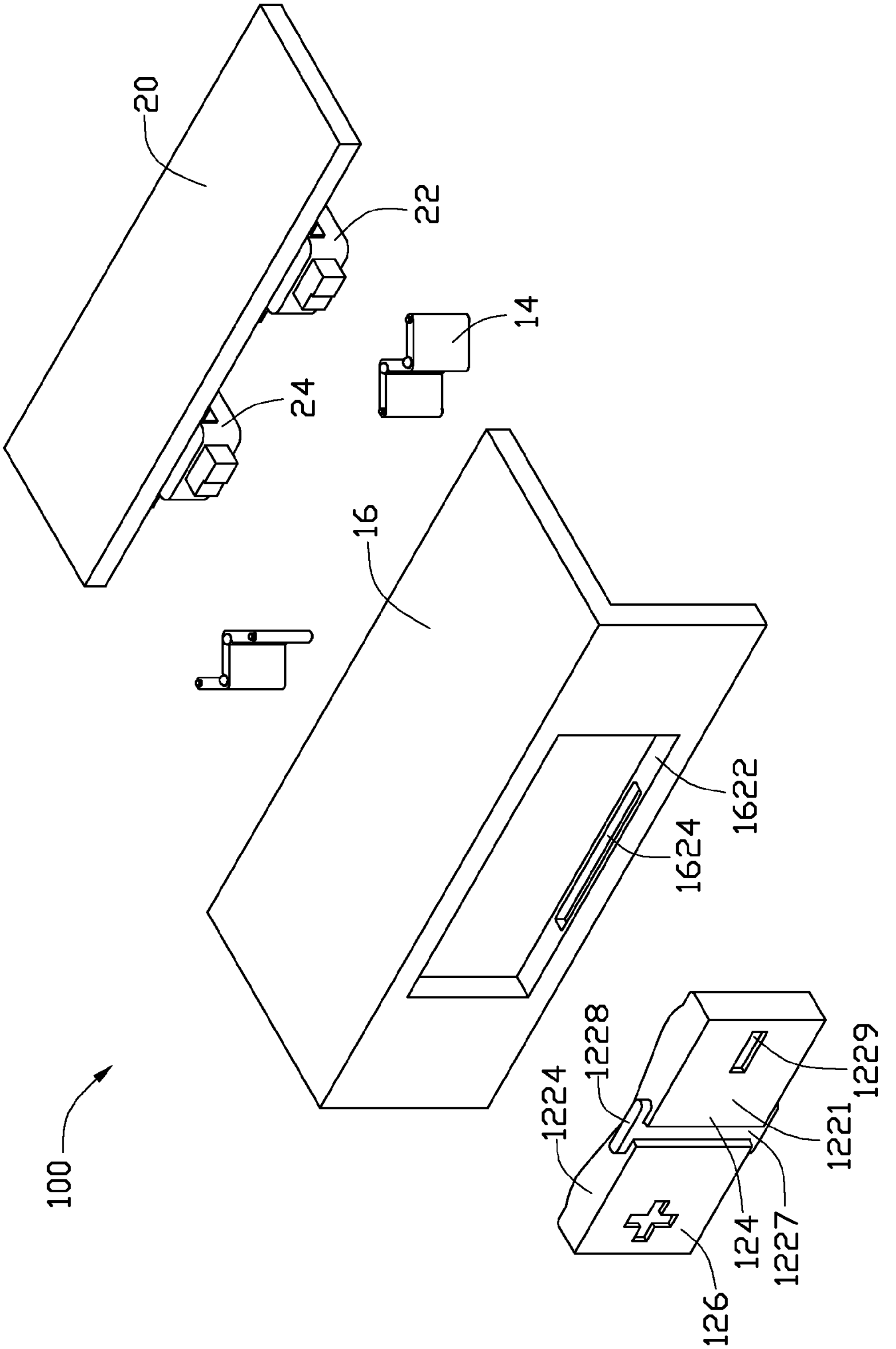
FIG. 2 is similar to FIG. 1, but showing the portable electronic device in another aspect.

Referring to FIGS. 1 and 2, an exemplary embodiment of a key assembly 10 can be used on a portable electronic device 100, such as a cellular phone or any electronic device where a key is desirable. The portable electronic device 100 includes a key assembly 10 and a circuit board 20. The circuit board 20 has a first switch 22 and a second switch 24 spaced from the first switch 22. The key assembly 10 is configured to press the first switch 22 and the second switch 24, to control the circuit board 20.

The key assembly 10 includes a key body 12, two resisting mechanisms 14 and a base plate 16. The key body 12 and the resisting mechanisms 14 are both mounted to the base plate 16. The base plate 16 may be a portion of the housing of the portable electronic device 100 or may be a separate element mounted to the housing of the portable electronic device 100. In this exemplary embodiment, the base plate 16 is a portion of the housing of the portable electronic device 100.

The key body 12 includes an operating surface 1221 facing the outside of the portable electronic device, a contacting surface 1222 opposite to the operating surface 1221, a first side surface 1223, a second side surface 1224 opposite to the first side surface 1223, a first end 1225 and a second end 1226 opposite to the first end 1225. The operating surface 1221 has a trough 1227 transversely defined near a center thereof, thus the key body 12 is divided into a first key section 124 located one side of the trough 1227 and a second key section 126 located another side of the trough 1227. The first key section 124 corresponds to the first switch 22, the second key section 126 corresponds to the second switch 24. The key body 12 further has two guiding blocks 1228 protruding from the first side surface 1223 and the second side surface 1224, respectively. The guiding blocks 1228 are coaxial and are slidably assembled to the base plate 16.

The operating surface 1221 has indicia 1229 respectively defined in the first key section 124 and the second key section 126, to indicate the function of the first key section 124 and the second key section 126. The indicia 1229 of the first key section 124 may be a "–", to indicating the function of the second key section 126 is decreasing volume. The indicia 1229 of the second key section 126 may be a "+", to indicate the function of the first key section 124 is increasing volume.

The key body 12 has a first arcuate contacting portion 1242 protruding from the contacting surface 1222 at the first key section 124. The first contacting portion 1242 corresponds to and is configured to trigger the first switch 22. The key body 12 has a second arcuate contacting portion 1262 protruding from the contacting surface 1222 at the second key section 126. The second contacting portion 1262 corresponds to and is configured to trigger the second switch 24. The first contacting portion 1242 and the second contacting portion 1262 may be constructed from an injection-molded thermoplastic elastomer and configured to produce a point contact sensation in a user's fingertip to provide tactile feedback when a user presses the key body 12.

The key body 12 has two first mating grooves 1230 respectively defined at the first end 1225 and the second end 1226 through the contacting surface 1222. Thus, two opposite first inner surfaces 1231 are formed in each first mating groove 1230. Each first inner surface 1231 has a first hole 1232 defined therein that is configured to mate with the resisting mechanism.

Figure 4:
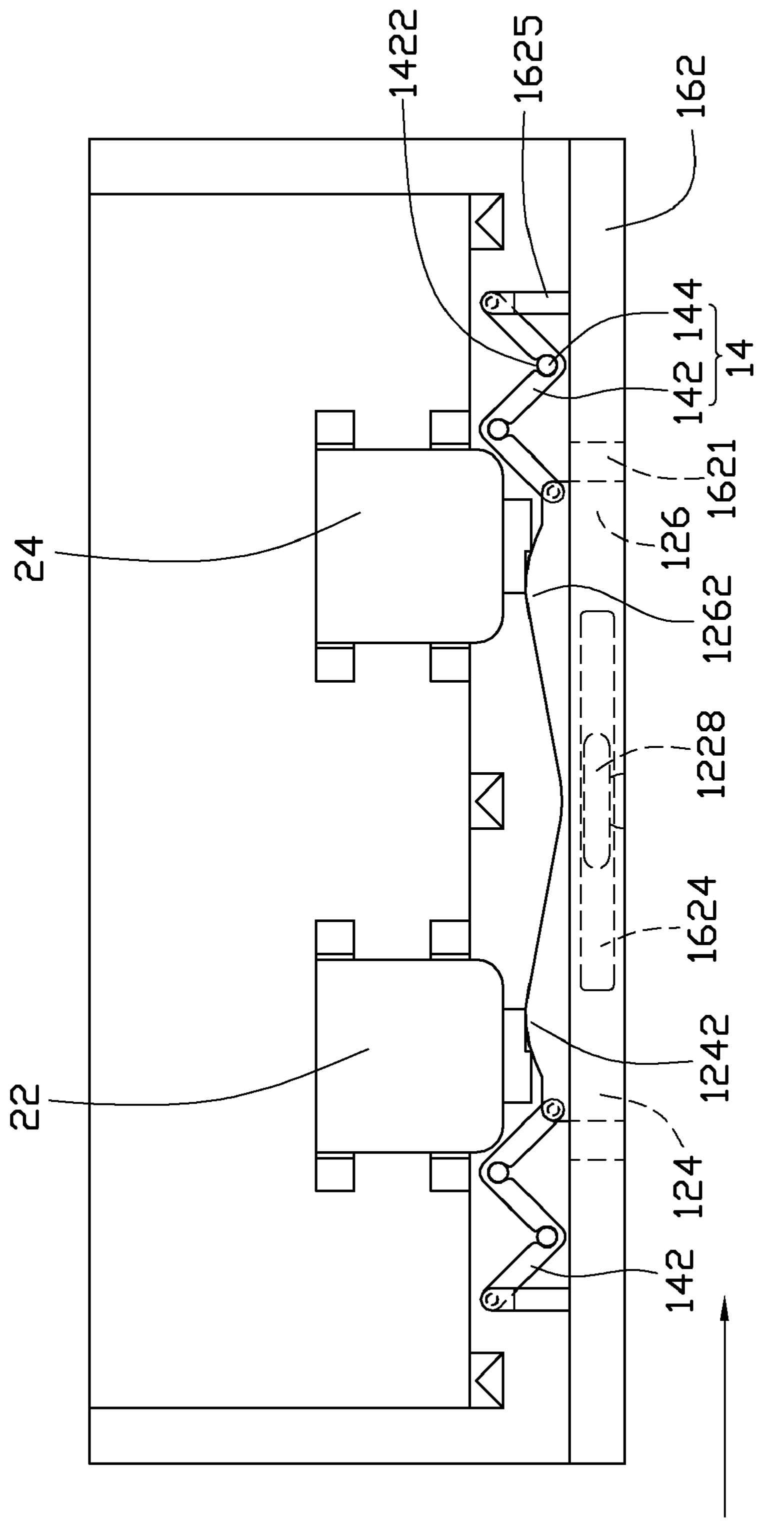
FIG. 4 is a perspective view of the portable electronic device shown in FIG. 3.
Figure 5:
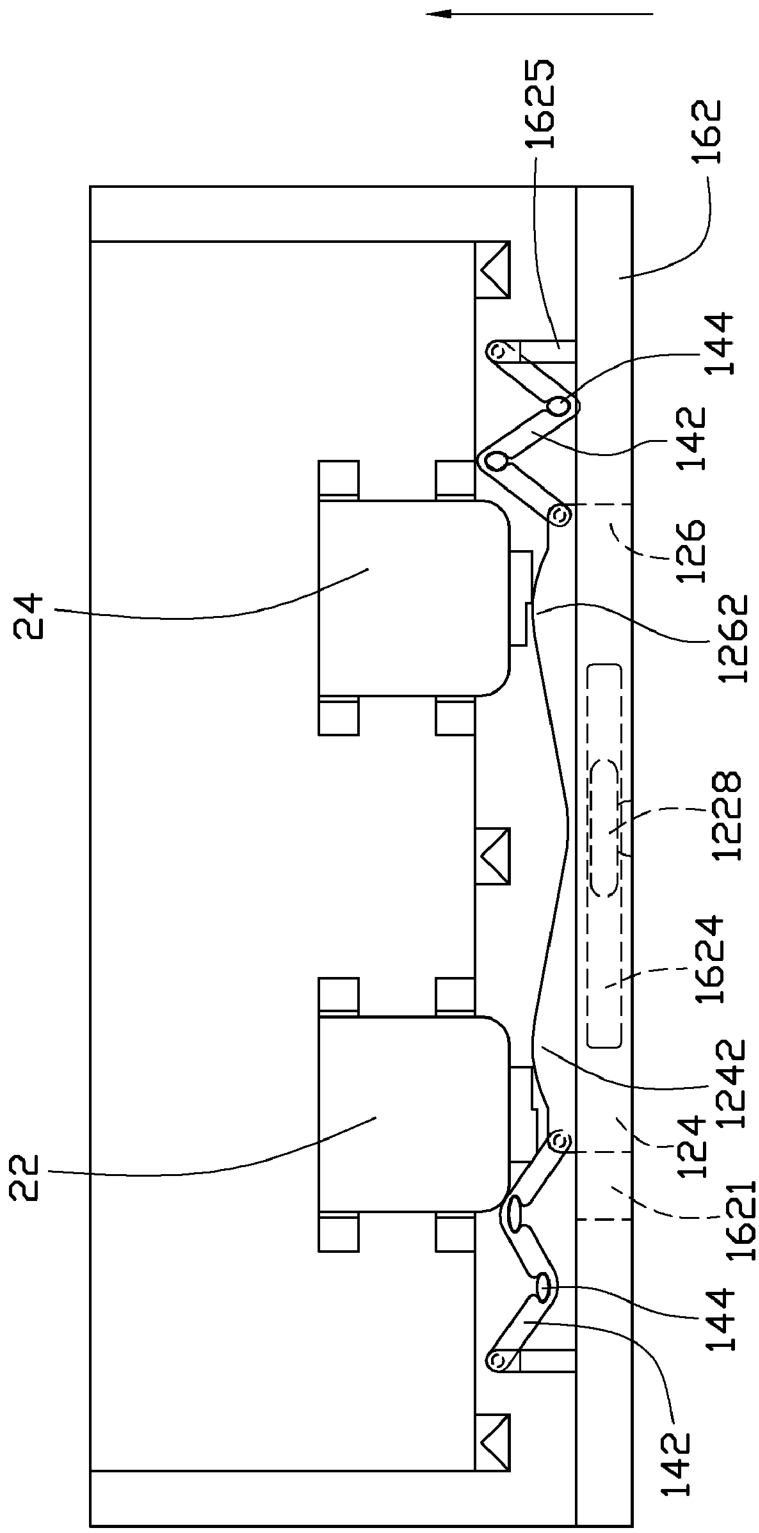
FIG. 5 is similar to FIG. 4, but one key section being in pressed state.

Referring to FIGS. 1 and 4, each resisting mechanism includes a retractable body 142 and a plurality of resilient members 144. The retractable body 142 is substantially wavy (e.g., N-shaped). In this exemplary embodiment, the retractable body 142 includes a plurality of rectangular portions connected with each other such that a plurality of connection joints are formed between adjacent rectangular portions. The retractable body 142 has a plurality of recesses 1422 (see FIG. 4) defined in an inner side of each connection joint. The recesses 1422 are configured for accommodating the resilient members 144. The resilient member 144 may be made of rubber and in form of elastic column. It is understood that the resilient member 144 may be other shape such as coil spring. The resilient members 144 are respectively situated at a respective connection joint of the rectangular portion. The resilient member 144 may be constructed from an injection-molded thermoplastic elastomer, and may be integrally molded with the retractable body 142. Referring to FIG. 5, when the retractable bodys 142 are compressed or stretched, the resilient members 144 correspondingly are compressed or stretched to accumulate rebound force for the retractable body 142. One end of each retractable body 142 has two first shafts 1424 coaxially protruding from two opposite sides thereof. The first shafts 1424 are ratatably accommodated in the first hole 1232, correspondingly. Another end of each retractable body 142 has two second shafts 1426 coaxially protruding from two opposite sides thereof. The second shafts 1426 are configured to mate with the base plate 16.

The base plate 16 includes a peripheral wall 162 and a bottom wall 164 substantially perpendicularly connected to the peripheral wall 162. The peripheral wall 162 has a opening 1621 defined therein corresponding to the key body 12. The opening 1621 is sized and configured to be engaged with the key body 12. The peripheral wall 162 two first inner walls 1622 parallel to the bottom wall 164 and two second inner walls 1623 perpendicularly to the bottom wall 164.

The peripheral wall 162 further has two guiding grooves 1624 defined in the first inner walls 1622, respectively. The guiding grooves 1624 correspond to and are configured to accommodate the guiding blocks 1228 therein. The peripheral wall 162 further has two plates 1625 protruding from two sides of the opening 1621, and the plates 1625 may be parallel to the second inner walls 1623. Each raised plate 1625 defines a second mating groove 1626 therein. Thus, two opposite second inner surfaces 1627 are formed in each second mating groove 1626. Each second inner surface 1627 has a second hole 1628 defined therein that is configured to mate with the second shafts 1426 of the resisting mechanism 14.

Figure 3:
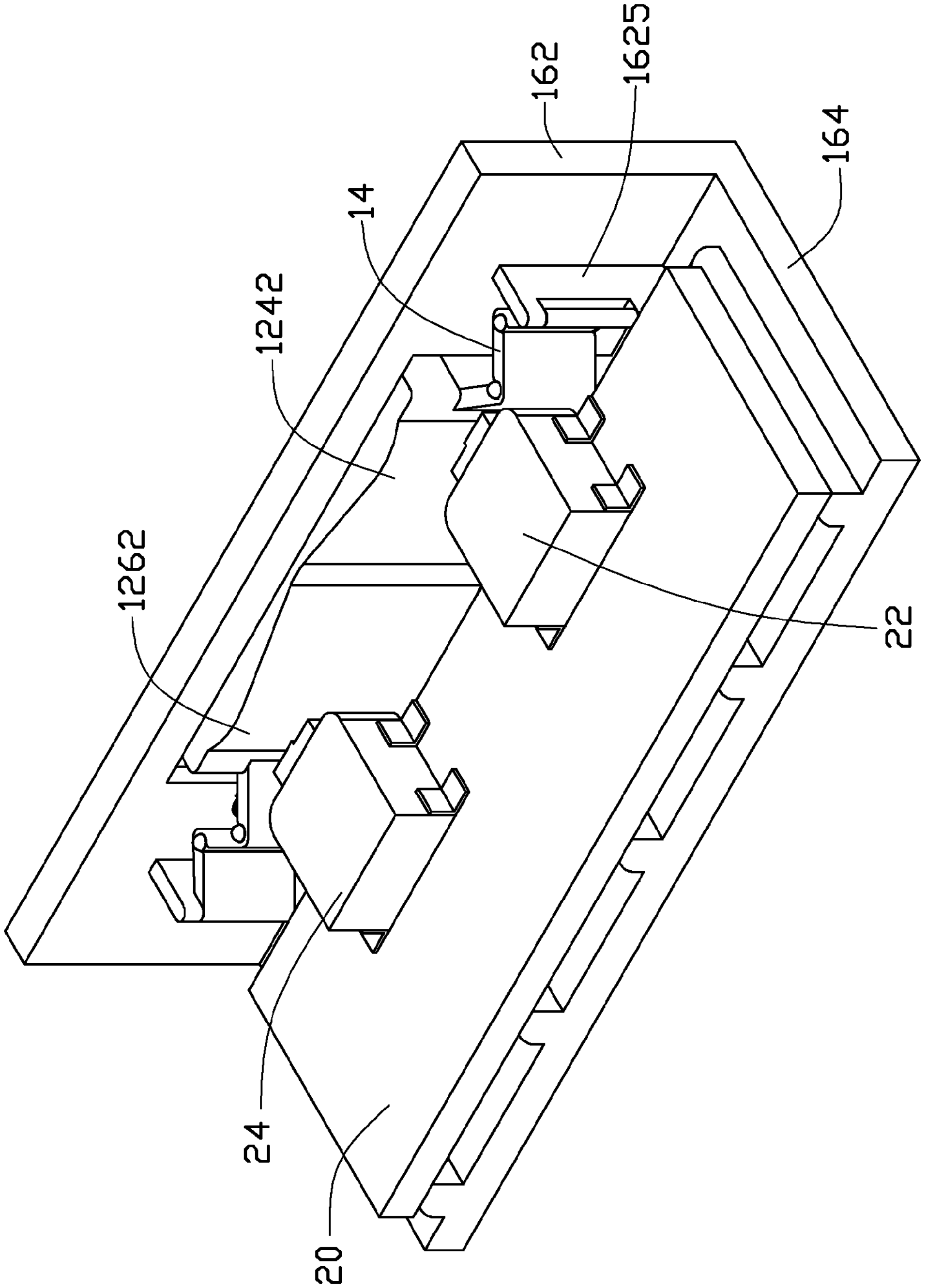
FIG. 3 is an assembled, isometric view of the portable electronic device shown in FIG. 1.

Referring to FIGS. 3 to 5, to assemble the portable electronic device 100, Firstly, the second shafts 1426 of the resisting mechanisms 14 are respectively latched in the second holes 1628 of the base plate 16, so one ends of the resisting mechanisms 14 are secured to the base plate 16. Secondly, the guiding blocks 1228 of the key body 12 are accommodated in the guiding grooves 1624 of the base plate 16, to securely mount the key body 12 to the base plate 16. Then, the first shafts 1424 of the resisting mechanisms 14 are respectively latched in the first hole 1232 of the key body 12, so another ends of the resisting mechanisms 14 are secured to the key body 12.

After that, the circuit board 20 is mounted to the bottom wall 164. At this stage, the first switch 22 is resisted against the area of the first contacting portion 1242 adjacent to the contacting surface 1222. In other words, the first switch 22 is resisted against the first contacting portion 1242 but don't resist against the high-point of the first contacting portion 1242. The second switch 24 is resisted against the area of the second contacting portion 1262 adjacent to the contacting surface 1222. In other words, the second switch 24 is resisted against the second contacting portion 1262 but don't resist against the high-point of the second contacting portion 1262.

Referring further to FIGS. 4 and 5, the use of the key assembly 10 will be described relative to the second key section 126. However, such action equally applies to the first key section 124. Firstly, the second key section 126 is pushed in the direction of the arrow shown in FIG. 4, so the key body 12 is slid in the opening 1621 in the direction of the arrow shown in FIG. 4. At this time, the guiding blocks 1228 slide in the guiding grooves 1624, the second key section 126 compresses the retractable body 142 and the resilient members 144 mounted on the second key section 126 to accumulate elastic force, thus the key body 12 can rebound when it is released. The high-point of the second contacting portion 1262 move toward the second switch 24, i.e., the second contacting portion 1262 presses and triggers the second switch 24 in the direction of the arrow shown in FIG. 6. Simultaneously, the first key section 124 moves in the direction of the arrow shown in FIG. 4, i.e., the high-point of the first contacting portion 1242 moves away from the first switch 22, to prevent from triggering the first switch 22. Thus, a user's fingertip touches only one key section at a time, thus removing the possibility of hitting two keys simultaneously. Moreover, the first key section 124 stretches the retractable body 142 and the resilient members 144 mounted thereon to accumulate elastic force, so the key body 12 can rebound quickly when it is released.

It is to be understood, however, that even though numerous characteristics and advantages of the exemplary disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A key assembly comprising:

a base plate;

two resisting mechanisms, the resisting mechanisms being both mounted to the base plate, and the resisting mechanisms being spaced from and opposite to each other, each resisting mechanism including a retractable body and a plurality of resilient members, the retractable body having a plurality of portions joined with each other such that a plurality of connection joints are formed between adjacent rectangular portions, the resilient members respectively situated at the connection joints of the retractable body; and a key body, the key body slidably mounted to the base plate between the two resisting mechanisms, the key body including a first key section and a second key section connected with the first key section, the first key section having a first arcuate contacting portion formed thereon, the second key section having a second arcuate contacting portion formed thereon;

wherein one of the resisting mechanisms is mounted to the first key section, another one of the resisting mechanisms is mounted to the second key section, when the first key section slides toward said one of the resisting mechanisms and compresses the retractable body and the resilient members of said one of the resisting mechanisms, the second key section slides away from the other one of the resisting mechanisms and stretches the retractable body and the resilient members of the one of the resisting mechanisms; the retractable body has a plurality of recesses defined in an inner side of each connection joint, the resilient members are respectively accommodated in the recesses.

2. The key assembly of claim 1, wherein the resilient members are integrally molded with the retractable body.

3. The key assembly of claim 1, wherein each retractable body is wavy.

4. The key assembly of claim 3, wherein each retractable body is N-shaped.

5. The key assembly of claim 1, wherein the resilient members be constructed from injection-molded thermoplastic elastomer.

6. The key assembly of claim 1, wherein the key body has two guiding blocks respectively protruding from two opposite side surface thereof, the base plate has two guiding grooves defined therein corresponding to the guiding blocks, the guiding blocks are slidably accommodated in the guiding grooves.

7. The key assembly of claim 6, wherein the base plate has a opening defined therein, the opening is configured for accommodated the key body therein, the guiding grooves are respectively defined in two opposite inner walls in the opening.

8. The key assembly of claim 7, wherein the key body has two first mating grooves respectively defined at two opposite ends thereof, two opposite first inner surfaces are formed in each first mating groove, and each first inner surface has a first hole defined therein, one end of each retractable body has two first shafts protruding from two opposite sides thereof, the first shafts are rotatably accommodated in the first holes.

9. The key assembly of claim 8, wherein another end of each retractable body has two second shafts protruding from two opposite sides thereof, the base plate further has two plates protruding from two sides of the opening, each raised plate defines a second mating groove therein, two opposite second inner surfaces are formed in each second mating groove, each second inner surface has a second hole defined therein, the second shafts are rotatably accommodated in the second holes.

10. The portable electronic device of claim 8, wherein another end of each retractable body has two second shafts protruding from two opposite sides thereof, the base plate further has two plates protruding from two sides of the opening, each raised plate defines a second mating groove therein, two opposite second inner surfaces are formed in each second mating groove, each second inner surface has a second hole defined therein, the second shafts are rotatably accommodated in the second holes.

11. A portable electronic device comprising:

a circuit board, the circuit board has a first switch and a second switch mounted thereon; and a key assembly comprising:

a base plate;

two resisting mechanisms, the resisting mechanisms being both mounted to the base plate, and the resisting mechanisms being spaced from and opposite to each other, each resisting mechanism including a retractable body and a plurality of resilient member, the retractable body having a plurality of portions joined with each other such that a plurality of connection joints formed between adjacent rectangular portions, the resilient members respectively situated at the connection joints of the retractable body; and a key body, the key body slidably mounted to the base plate between the two resisting mechanisms, the key body including a first key section and a second key section connected with the first key section, the first key section having a first arcuate contacting portion formed thereon, the second key section having a second arcuate contacting portion formed thereon;

wherein one of the resisting mechanisms is mounted to the first key section, another one of the resisting mechanisms is mounted to the second key section, when the first key section slides toward said one of the resisting mechanisms and compresses the retractable body and the resilient members of the one of the resisting mechanisms, to trigger the first switch, the second key section slides away from the other one of the resisting mechanisms and stretches the retractable body and the resilient members of said one of the resisting mechanisms, to prevent triggering the second switch; the retractable body has a plurality of recesses defined in an inner side of each connection joint, the resilient members are respectively accommodated in the recesses.

12. The portable electronic device of claim 11, wherein the resilient members are integrally molded with the retractable body.

13. The portable electronic device of claim 11, wherein each retractable body is wavy.

14. The portable electronic device of claim 13, wherein each retractable body is N-shaped.

15. The portable electronic device of claim 11, wherein the resilient members be constructed from injection-molded thermoplastic elastomer.

16. The portable electronic device of claim 11, wherein the key body has two guiding blocks respectively protruding from two opposite side surface thereof, the base plate has two guiding grooves defined therein corresponding to the guiding blocks, the guiding blocks are slidably accommodated in the guiding grooves.

17. The portable electronic device of claim 16, wherein the base plate has a opening defined therein, the opening is configured for accommodated the key body therein, the guiding grooves are respectively defined in two opposite inner walls in the opening.

18. The portable electronic device of claim 17, wherein the key body has two first mating grooves respectively defined at two opposite ends thereof, two opposite first inner surfaces are formed in each first mating groove, and each first inner surface has a first hole defined therein, one end of each retractable body has two first shafts protruding from two opposite sides thereof, the first shafts are rotatably accommodated in the first holes.

* * * * *